(12) United States Patent
Paik

(10) Patent No.: US 12,080,367 B2
(45) Date of Patent: Sep. 3, 2024

(54) MEMORY AND OPERATION METHOD THEREOF INCLUDING ACCESSING REDUNDANCY WORLD LINES BY MEMORY CONTROLLER

(71) Applicant: SK hynix Inc., Gyeonggi-do (KR)

(72) Inventor: Woo-Hyun Paik, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 587 days.

(21) Appl. No.: 16/596,368

(22) Filed: Oct. 8, 2019

(65) Prior Publication Data

US 2020/0265916 A1 Aug. 20, 2020

(30) Foreign Application Priority Data

Feb. 20, 2019 (KR) ........................ 10-2019-0019769

(51) Int. Cl.
*G11C 29/00* (2006.01)
*G11C 8/08* (2006.01)
*G11C 8/10* (2006.01)

(52) U.S. Cl.
CPC .............. *G11C 29/883* (2013.01); *G11C 8/08* (2013.01); *G11C 8/10* (2013.01)

(58) Field of Classification Search
None
See application file for complete search history.

(56) References Cited

U.S. PATENT DOCUMENTS

| | | | | |
|---|---|---|---|---|
| 5,544,106 A | * | 8/1996 | Koike ................... | G11C 29/80 365/201 |
| 5,548,555 A | * | 8/1996 | Lee ....................... | G11C 29/24 365/225.7 |
| 5,652,725 A | * | 7/1997 | Suma .................... | G11C 29/24 365/201 |
| 5,784,321 A | * | 7/1998 | Yamamura ........... | G11C 29/838 365/201 |
| 5,801,986 A | * | 9/1998 | Matsumoto ........... | G11C 29/24 365/201 |
| 9,779,796 B1 | | 10/2017 | Vimercati et al. | |
| 2001/0055233 A1 | * | 12/2001 | Nagai .................. | G11C 29/808 365/96 |

(Continued)

FOREIGN PATENT DOCUMENTS

| CN | 1825492 A | 8/2006 |
|---|---|---|
| CN | 1892903 A | 1/2007 |

(Continued)

OTHER PUBLICATIONS

Office Action for the Chinese Patent Application No. 201911271903.2 issued by the Chinese Patent Office on Feb. 22, 2023.

(Continued)

*Primary Examiner* — J. H. Hur
(74) *Attorney, Agent, or Firm* — IP & T GROUP LLP

(57) ABSTRACT

An operation method of a memory including normal word lines and redundancy word lines may include receiving a row redundancy information and a flag signal along with an active command and a row address; and activating one of the redundancy word lines by decoding the row redundancy information according to a logic level of the flag signal.

10 Claims, 2 Drawing Sheets

(56) References Cited

U.S. PATENT DOCUMENTS

| | | | | |
|---|---|---|---|---|
| 2004/0221210 A1* | 11/2004 | Hoffmann | ............... | G11C 29/24 |
| | | | | 714/719 |
| 2006/0133126 A1* | 6/2006 | Fujisawa | ................ | G11C 5/066 |
| | | | | 365/63 |
| 2010/0034038 A1* | 2/2010 | Freebern | .............. | G11C 7/1075 |
| | | | | 365/230.01 |
| 2018/0019023 A1* | 1/2018 | Han | .................... | G11C 11/4076 |
| 2019/0311773 A1* | 10/2019 | Jimenez-Olivares | ........................ | |
| | | | | G11C 5/147 |

FOREIGN PATENT DOCUMENTS

| | | | |
|---|---|---|---|
| CN | 105304138 | A | 2/2016 |
| CN | 108615544 | A | 10/2018 |
| CN | 111599392 | B | 3/2024 |
| JP | 2002-015593 | A | 1/2002 |
| KR | 20060072061 | A | 6/2006 |
| KR | 10-0909807 | | 7/2009 |
| KR | 10-2011-0088994 | A | 8/2011 |
| TW | 201106375 | A | 2/2011 |

OTHER PUBLICATIONS

Office Action for the Korean Patent Application No. 10-2019-0019769 issued by the Korean Intellectual Property Office on Mar. 27, 2024.

* cited by examiner

MEMORY AND OPERATION METHOD THEREOF INCLUDING ACCESSING REDUNDANCY WORLD LINES BY MEMORY CONTROLLER

CROSS-REFERENCE TO RELATED APPLICATION

This application claims priority under 35 U.S.C. § 119 to Korean Patent Application No. 10-2019-0019769 filed on Feb. 20, 2019, which is incorporated herein by reference in its entirety.

BACKGROUND

1. Field

Various embodiments relate to a memory, and more particularly, to repair of a memory.

2. Discussion of the Related Art

In the early stage of the semiconductor memory industry, a plurality of original good dies with no failed memory cell are distributed on a wafer in a memory chip having passed through a semiconductor manufacturing process. However, as the capacity of a memory gradually increases, it has become difficult to manufacture a memory with no failed memory cell. Currently, it seems impossible that such a memory will be manufactured. As a way for overcoming such a concern, a repair method is used to provide redundancy memory cells within a memory and replace failed cells with the redundancy memory cells.

In general, when a wafer fabrication process of a memory is completed, a test is performed to determine whether memory cells are normal. After the test, failed memory cells are replaced with memory cells for repair in the wafer state through a repair operation. This is normal repair in which the repair is performed in the wafer state. There is post package repair (PPR) that is performed after the memory is packaged. By using the post package repair technology, it is possible to repair failed memory cells which have not been found in the wafer state but occur when a user uses a memory device after packaging.

The post package repair (PPR) includes hard post package repair (Hard PPR) and soft post package repair (Soft PPR). The hard post package repair (Hard PPR) indicates post package repair in which a repair effect is permanently maintained through only one-time repair. The soft post package repair (Soft PPR) indicates temporary post package repair in which a repair effect disappears unless power is supplied to a memory. For example, when a hard repair operation is performed in order to replace a specific memory cell X with a redundancy memory cell Y, the memory cell X is permanently replaced with the redundancy memory cell Y, but when a soft repair operation is performed in order to replace the specific memory cell X with the redundancy memory cell Y, the repair operation for the memory cell X needs to be performed whenever power is newly supplied to a memory device.

In the related art, in the hard post package repair and the soft post package repair, the number of memory cells, which can be repaired, is limited due to the limitation of the number of fuses and the number of latches. Furthermore, it is necessary to perform a complicated procedure such as entering a post package repair mode to input a repair address and escaping from the post package repair mode.

SUMMARY

Various embodiments are directed to a technology capable of easily accessing redundancy word lines without limitation.

In an embodiment, an operation method of a memory including normal word lines and redundancy word lines may include: receiving a row redundancy information and a flag signal along with an active command and a row address; and activating one of the redundancy word lines by decoding the row redundancy information according to a logic level of the flag signal.

In another embodiment, a memory may include: normal word lines; redundancy word lines; a redundancy decoder configured to activate one of the redundancy word lines by decoding row redundancy information received through data pads when the memory determines to access the redundancy word lines; and a normal decoder configured to activate one of the normal word lines by decoding an address when the memory determines to access the normal word lines.

In another embodiment, a memory system may include a memory; and a memory controller configured to transfer row redundancy information to the memory along with a row active command and a row address.

In accordance with the embodiments, it is possible to easily access redundancy word lines of a memory without limitation.

DETAILED DESCRIPTION

Figure 1:
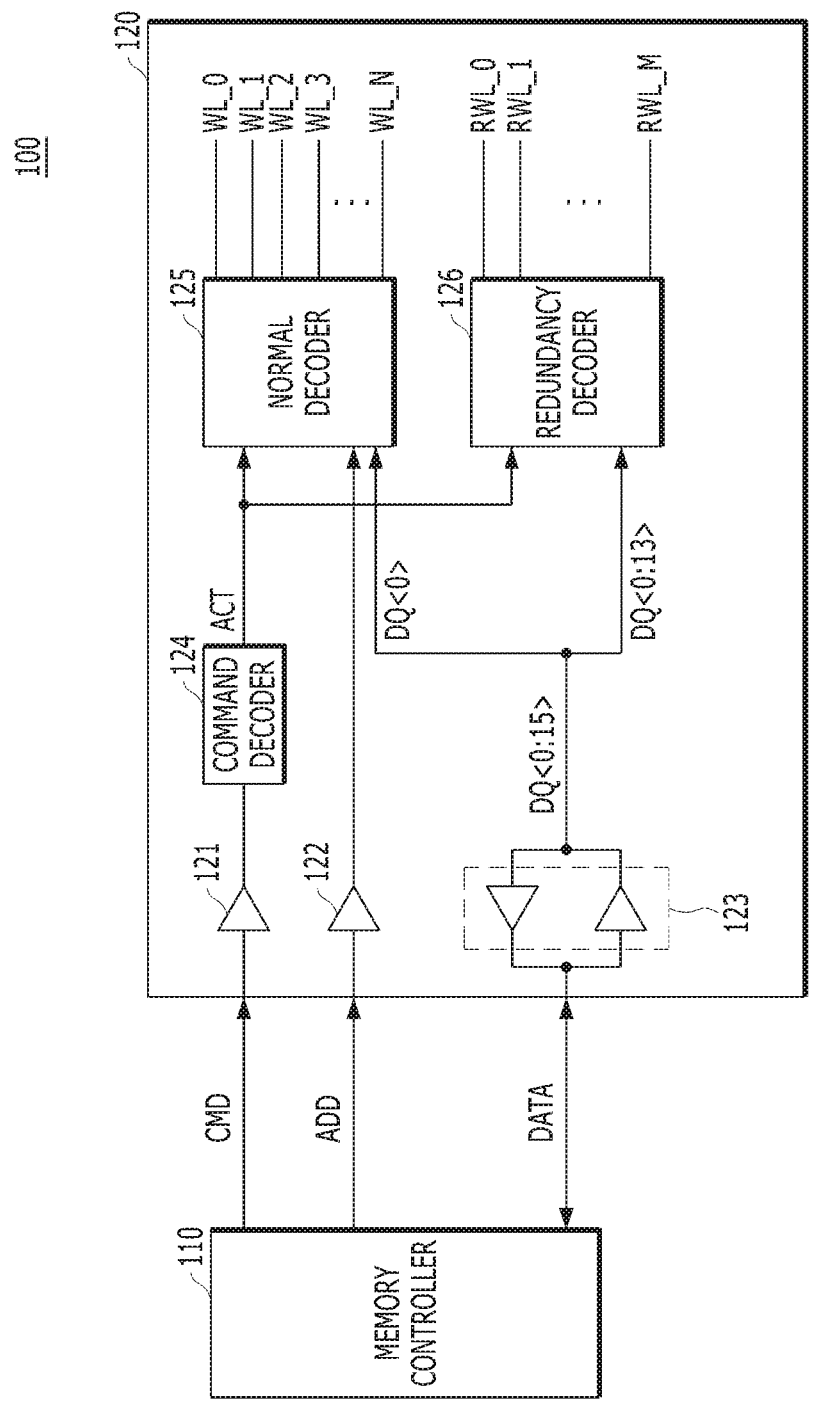
FIG. 1 is a block diagram illustrating a memory system in accordance with an embodiment of the invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

Throughout the specification, when one element is referred to as being 'connected to' or 'coupled to' another element, it may indicate that the former element is directly connected or coupled to the latter element or electrically connected or coupled to the latter element with another element interposed therebetween. Furthermore, when an element "includes" or "comprises" a component, it means that the element does not exclude another component but may further include or comprise another component, unless referred to the contrary. Moreover, although components described in the specification are represented in the form of a singular form, the present embodiment is not limited thereto, but the corresponding components may also be represented in the form of a plural form.

FIG. 1 is a block diagram illustrating a memory system 100 in accordance with an embodiment of the invention.

Referring to FIG. 1, the memory system 100 may include a memory controller 110 and a memory 120.

The memory controller 110 may control the memory 120. Specifically, the memory controller 110 may control an operation of the memory 120 by applying a command CMD and an address ADD to the memory 120, and transmit and receive data DATA to and from the memory 120.

The memory 120 may include a command reception circuit 121, an address reception circuit 122, a data transmission/reception circuit 123, a command decoder 124, a normal decoder 125, a redundancy decoder 126, normal word lines WL_0 to WL_N, and redundancy word lines RWL_0 to RWL_M. The memory 120 may include many other configurations; however, FIG. 1 illustrates only the configurations related to access to the normal word lines WL_0 to WL_N and the redundancy word lines RWL_0 to RWL_M.

The command reception circuit 121 may receive the command CMD from the memory controller 110. Since, in general, the command CMD may be consist of plural control signals such as a chip selection signal (i.e., CS), a row address strobe signal (i.e., RAS), a column address strobe signal (i.e., CAS), a write enable signal (i.e., WE), a clock enable signal (i.e., CKE), the command reception circuit 121 may include plural command pads and plural command receivers corresponding thereto. The address reception circuit 122 may receive the address ADD from the memory controller 110. Since the address ADD may be consist of a plurality of bits, the address reception circuit 122 may include a plurality of address pads and a plurality of address receivers corresponding thereto. The data transmission/reception circuit 123 may receive the data DATA transferred from the memory controller 110 and may transmit the data DATA to the memory controller 110. The data transmission/reception circuit 123 may include a plurality of data (I/O) pads, a plurality of data receivers and data transmitter corresponding thereto. In the figure, DQ<0:15> may indicate data received through 16 data pads. For example, DQ<0> may indicate a bit of data received through a data pad #0 and DQ<3> may indicate a bit of data received through a data pad #3.

The command decoder 124 may generate internal command signals by decoding the command CMD received through the command reception circuit 121. The internal command signals may include a read signal, a write signal, an active signal ACT, a precharge signal and the like. FIG. 1 illustrates only the active signal ACT directly related to the embodiment. The active signal ACT may be an internal command signal that is activated when an active operation is instructed by the command CMD.

The normal word lines WL_0 to WL_N indicate general word lines. In the embodiment, the term "normal" is used for distinguishing the normal word lines WL_0 to WL_N from the redundancy word lines RWL_0 to RWL_M. A plurality of normal memory cells may be electrically connected to each of the normal word lines WL_0 to WL_N. FIG. 1 illustrates that the normal word lines WL_0 to WL_N are disposed in one area; however, in the memory 120, the normal word lines WL_0 to WL_N may be distributedly disposed in various areas such as a plurality of memory banks.

The redundancy word lines RWL_0 to RWL_M may be word lines for replacing failed word lines among the normal word lines WL_0 to WL_N. A plurality of redundancy memory cells may be electrically connected to each of the redundancy word lines RWL_0 to RWL_M. FIG. 1 illustrates that the redundancy word lines RWL_0 to RWL_M are disposed in one area; however, in the memory 120, the redundancy word lines RWL_0 to RWL_M may be distributedly disposed in various areas such as a plurality of memory banks. The number of redundancy word lines RWL_0 to RWL_M may be smaller than that of normal word lines WL_0 to WL_N.

The normal decoder 125 may selectively activate one of the normal word lines WL_0 to WL_N by decoding the address ADD (i.e., row address) when the active signal ACT is activated, that is, when the active operation is instructed by the command CMD. The address ADD may include a bank address for selecting a target memory bank to be activated and a row address for selecting a normal word line to be activated in the selected memory bank. The normal decoder 125 may be activated when the data DQ<0> of the data pad #0 inputted along with the command CMD instructing the active operation has a logic low level, and may be deactivated when the data DQ<0> of the data pad #0 inputted along with the command CMD instructing the active operation has a logic high level.

The redundancy decoder 126 may selectively activate one of the redundancy word lines RWL_0 to RWL_M by decoding the data DQ<1:13> when the active signal ACT is activated. The redundancy decoder 126 may be activated when the data DQ<0> of the data pad #0 inputted along with the command CMD instructing the active operation has a logic high level, and may be deactivated when the data DQ<0> of the data pad #0 inputted along with the command CMD instructing the active operation has a logic low level. In general, since data is inputted along with the command CMD instructing a write operation, no data is inputted when the command CMD instructing the active operation is applied. Accordingly, signals DQ<0:15> inputted along with the command CMD instructing the active operation through the data pads are address information (i.e., row redundancy information).

Table 1 below indicates information included in the signals DQ<0:13> inputted along with a (row) active command (i.e., the command CMD instructing the active operation). The signals DQ<14:15> may not be used (i.e., Don't Care) by the redundancy decoder 126.

TABLE 1

| Memory Bank Groups | | Memory Banks | | Quarters | | RWL Select Bits | | | | | | | Enable |
|---|---|---|---|---|---|---|---|---|---|---|---|---|---|
| DQ<13> | DQ<12> | DQ<11> | DQ<10> | DQ<9> | DQ<8> | DQ<7> | DQ<6> | DQ<5> | DQ<4> | DQ<3> | DQ<2> | DQ<1> | DQ<0> |

Among the data inputted along with the active command, the signal DQ<0> may be used to select a decoder to be activated between the normal decoder 125 and the redundancy decoder 126. For example, when the signal DQ<0> is at a logic low level, one of the normal word lines WL_0 to WL_N may be activated, and when the signal DQ<0> is at a logic high level, one of the redundancy word lines RWL_0 to RWL_M may be activated. That is, the signal DQ<0> may be used as an enable signal or a flag signal. FIG. 1 illustrates an example in which the signal DQ<O> is used to select a decoder to be activated between the normal decoder 125 and the redundancy decoder 126; however, a separate flag signal, other than the signal DQ<0>, may be transferred from the memory controller 110 to the memory 120 along with the active command, and may be used to select a decoder to be activated between the normal decoder 125 and the redundancy decoder 126 according to a level of the separate flag signal.

The signals DQ<12:13> may be used to select a memory bank group including a redundancy word line to be activated, and the signals DQ<10:11> may be used to select a memory bank to be activated in the selected memory bank group. The DQ<8:9> may be used to select an area (hereinafter, referred to as a quarter) to be activated in the selected memory bank. Furthermore, the signals DQ<1:7> may be used to select a redundancy word line to be activated in the selected area within the selected memory bank.

Figure 2:
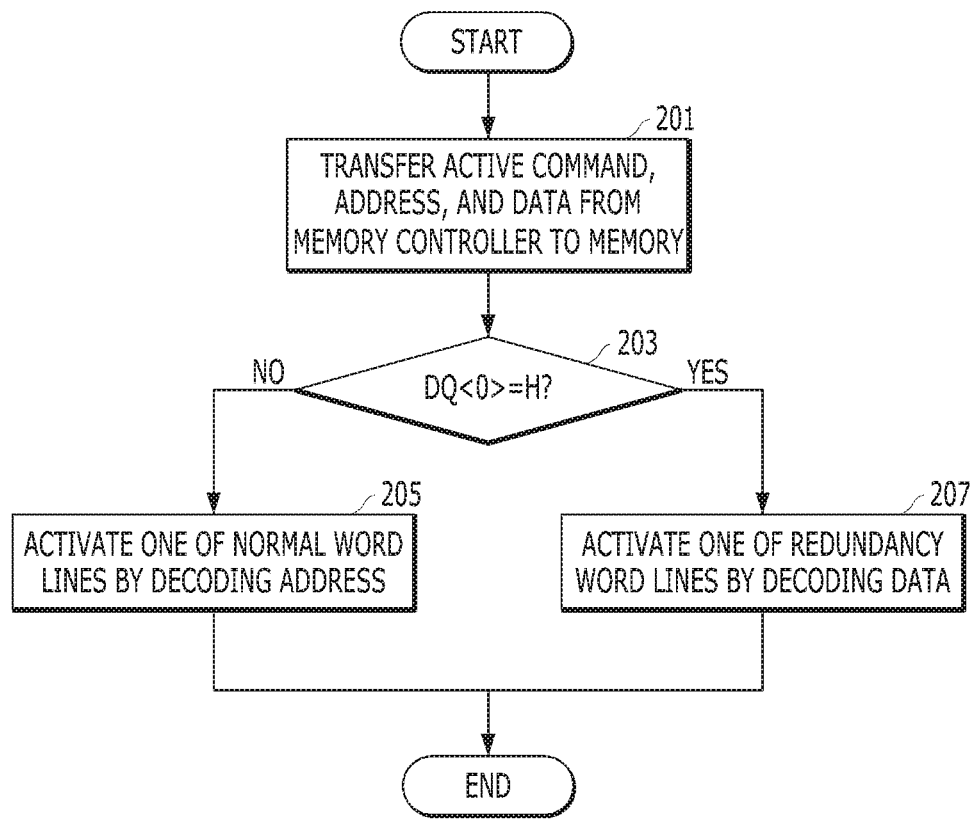
FIG. 2 is a flowchart for describing an operation method of the memory system shown in FIG. 1.

FIG. 2 is a flowchart for describing an operation method of the memory system 100 shown in FIG. 1.

Referring to FIG. 2, the address ADD and the data DATA may be transmitted from the memory controller 110 to the memory 120 along with the active command CMD at step 201. In an existing memory system, in the active operation, only the address is transmitted from the memory controller to the memory along with the active command; however, differently from the existing memory system, in the embodiment, not only the address ADD but also the data DATA are transmitted from the memory controller 110 to the memory 120 as row redundancy information. The address ADD and the data DATA may be transferred from the memory controller 110 to the memory 120 simultaneously with the command CMD instructing the active operation.

The memory 120 may check whether the signal DQ<0> received along with the active command has a logic high at step 203. In the embodiment, the signal DQ<0> is used as a flag signal for determining word lines to be accessed between the normal word lines WL<0:N> and the redundancy word lines RWL<0:M>; however, a separate flag signal may also be used to determine word lines to be accessed between the normal word lines VVL<0:N> and the redundancy word lines RWL<0:M>.

When the signal DQ<0> has a logic low level ('NO' in step 203), the normal decoder 125 may be activated and then may activate one of the normal word lines WL_0 to WL_N by decoding the address ADD at step 205.

When the signal DQ<0> has a logic high level ('YES' in step 203), the redundancy decoder 126 may be activated and then may activate one of the redundancy word lines RWL_0 to RWL_M by decoding the data DQ<1:13> at step 207.

Referring to FIG. 2, not only the address ADD but also the data DATA are transferred from the memory controller 110 to the memory 120 along with the command CMD instructing the active operation, so that it is possible to freely access one of the normal word lines WL_0 to WL_N and the redundancy word lines RWL_0 to RWL_M in an on-the-fly manner. In addition, since additional circuits such as latches are not required to access the redundancy word lines RWL_0 to RWL_M, it is possible to access the entire redundancy word lines RWL_0 to RWL_M without limitation.

Although, in the previous embodiments of the invention, it is described that a memory controller transfers row redundancy information along with an active command through data pads, alternative signals transferred through pads other than the data pads, which are not to be used in an active operation, may be used as the redundancy information.

Although various embodiments have been described for illustrative purposes, it will be apparent to those skilled in the art that various changes and modifications may be made without departing from the spirit and scope of the invention as defined in the following claims.

What is claimed is:

1. An operation method of a memory including normal word lines and redundancy word lines for replacing failed word lines among the normal word lines according to row redundancy information, the operation method comprising:
   receiving from a memory controller, a row address, data to be written to the memory, an active command instructing activation of the memory, the row redundancy information, and a flag signal;
   determining whether the flag signal is activated or deactivated;
   decoding, when the flag signal is deactivated, the row address which is received through address pads during a row activation operation which, with the flag deactivated, activates one of the normal word lines; and
   decoding, when the flag signal is activated, the row redundancy information which is received through data I/O pads along with the active command and the data to be written to the memory during the row activation operation which, with the flag activated, activates one of the redundancy word lines,
   wherein, during a write operation, the data to be written in the memory is received through the data I/O pads and written to the normal word lines or the redundancy word lines depending on the flag signal, wherein the flag signal is received through the data I/O pads, wherein the data I/O pads are separate from the address pads.

2. The operation method of claim 1, wherein the row redundancy information includes one bit corresponding to the flag signal and remaining bits indicating one of the redundancy word lines to be activated when the flag signal is activated.

3. The operation method of claim 1, wherein the receiving from a memory controller comprises, depending on the flag signal, accessing either of the normal word lines and the redundancy word lines.

4. The operation method of claim 3, wherein the accessing comprises an on-the-fly accessing of either of the normal word lines and the redundancy word lines.

5. The operation method of claim 3, wherein the accessing of the redundancy word lines does not require latches to access either of the normal word lines and the redundancy word lines.

6. A memory comprising:
   normal word lines;
   redundancy word lines for replacing failed word lines among the normal word lines according to row redundancy information;
   a normal decoder configured to decode a row address which is received though address pads during a row active operation which activates one of the normal word lines when the normal decoder is activated; and a redundancy decoder configured to decode the row redundancy information which is received through data I/O pads along with the active command and the data to be written to the memory when the redundancy decoder is activated, wherein, during a write operation, the data to be written in the memory is received through the data I/O pads, and wherein the memory receives, included with the row redundancy information, a flag signal, the flag signal selectively activating the normal decoder or the redundancy decoder, wherein the flag signal is received through the data I/O pads, wherein the data I/O pads are separate from the address pads.

7. The memory of claim 6, wherein the row redundancy information includes one bit corresponding to the flag signal and remaining bits indicating one of the redundancy word lines to be activated when the flag signal is activated.

8. The memory of claim 6, wherein, during the write operation, the data to be written in the memory is capable of being written to either of the normal word lines and the redundancy word lines depending on the flag signal.

9. The memory of claim 8, wherein the data to be written in the memory is capable of being written in an on-the-fly accessing of either of the normal word lines and the redundancy word lines.

10. The memory of claim 8, wherein the data to be written to the redundancy words does not require latches to access the redundancy word lines.

* * * * *